(12) United States Patent
Kogure et al.

(10) Patent No.: US 10,187,970 B2
(45) Date of Patent: Jan. 22, 2019

(54) MULTILAYER SUBSTRATE

(71) Applicant: Murata Manufacturing Co., Ltd., Kyoto (JP)

(72) Inventors: Takeshi Kogure, Kyoto (JP); Atsushi Ono, Kyoto (JP); Hiroyuki Nagamori, Kyoto (JP); Takanori Uejima, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/474,146

(22) Filed: Mar. 30, 2017

(65) Prior Publication Data
US 2017/0208677 A1    Jul. 20, 2017

Related U.S. Application Data

(63) Continuation of application No. PCT/JP2015/076837, filed on Sep. 24, 2015.

(30) Foreign Application Priority Data

Sep. 30, 2014    (JP) .................................. 2014-200123

(51) Int. Cl.
     *H05K 1/02*       (2006.01)
     *H05K 1/18*       (2006.01)
     (Continued)

(52) U.S. Cl.
     CPC ......... *H05K 1/0206* (2013.01); *H01L 21/486* (2013.01); *H01L 21/4857* (2013.01);
     (Continued)

(58) Field of Classification Search
     CPC .. H05K 1/0206; H05K 3/4644; H05K 3/4038; H05K 1/113; H05K 1/0306;
     (Continued)

(56) References Cited

U.S. PATENT DOCUMENTS 5,110,654 A * 5/1992 Yokokawa ............ H01L 21/486
                                                  174/255
6,136,419 A * 10/2000 Fasano .................... B32B 18/00
                                                  174/250

(Continued)

FOREIGN PATENT DOCUMENTS

JP      H06-31174 U     4/1994
JP      H07-97705 B2    10/1995
(Continued)

OTHER PUBLICATIONS

International Search Report issued in Application No. PCT/JP2015/076837 dated Dec. 28, 2015.
(Continued)

*Primary Examiner* — Ishwarbhai B Patel
(74) *Attorney, Agent, or Firm* — Pearne & Gordon LLP

(57) ABSTRACT

A multilayer substrate includes a component mounting electrode, an external mounting electrode, and a heat dissipating unit. The component mounting electrode is connected to an electronic component that is connected to an external structure. The heat dissipating unit is constituted by a plurality of via-conductors partially superposed each other in a stacking direction of the multilayer substrate and disposed continuously between the component mounting electrode and the external mounting electrode. The heat dissipating unit includes communicating portions, each in which one via-conductor is disposed per ceramic layer, and a branching portion in which a plurality of via-conductors are disposed continuously between the communicating portions per ceramic layer. Where the via-conductors of the branching portion and the via-conductor of the communicating portion are adjacent to each other, the positions of the centers of the adjacent via-conductors are separated from each other as viewed from the stacking direction.

20 Claims, 5 Drawing Sheets

(51) Int. Cl.
*H05K 1/03* (2006.01)
*H01L 23/12* (2006.01)
*H01L 21/48* (2006.01)
*H01L 23/367* (2006.01)
*H01L 23/498* (2006.01)
*H05K 1/11* (2006.01)
*H05K 3/40* (2006.01)
*H05K 3/46* (2006.01)

(52) U.S. Cl.
CPC ............ *H01L 23/12* (2013.01); *H01L 23/367* (2013.01); *H01L 23/49822* (2013.01); *H01L 23/49827* (2013.01); *H01L 23/49838* (2013.01); *H01L 23/49894* (2013.01); *H05K 1/0306* (2013.01); *H05K 1/113* (2013.01); *H05K 1/181* (2013.01); *H05K 3/4038* (2013.01); *H05K 3/4644* (2013.01); *H01L 2924/0002* (2013.01); *H05K 3/4629* (2013.01); *H05K 2201/096* (2013.01); *H05K 2201/0979* (2013.01); *H05K 2201/1003* (2013.01); *H05K 2201/10015* (2013.01); *H05K 2201/10022* (2013.01); *H05K 2201/10734* (2013.01)

(58) Field of Classification Search
CPC . H05K 2201/1003; H05K 2201/10015; H05K 2201/10022; H05K 1/181; H01L 23/49894; H01L 21/486; H01L 21/4857; H01L 23/367; H01L 23/49838; H01L 23/49827; H01L 23/49822
See application file for complete search history.

(56) References Cited

U.S. PATENT DOCUMENTS

| | | | | |
|---|---|---|---|---|
| 7,656,677 | B2* | 2/2010 | Ogawa | H01L 23/5383 |
| | | | | 174/260 |
| 9,006,586 | B2* | 4/2015 | Horiuchi | H01L 23/49822 |
| | | | | 174/255 |
| 2008/0164053 | A1* | 7/2008 | Matsubara | H01L 21/4857 |
| | | | | 174/255 |
| 2010/0295170 | A1 | 11/2010 | Komura | |
| 2012/0018193 | A1 | 1/2012 | Hong | |

FOREIGN PATENT DOCUMENTS

| | | |
|---|---|---|
| JP | 2002-267781 A | 9/2002 |
| JP | 2006-041242 A | 2/2006 |
| JP | 2008-251850 A | 10/2008 |
| JP | 2011-009715 A | 1/2011 |
| JP | 2012-028730 A | 2/2012 |
| WO | 2007/026455 A1 | 3/2007 |

OTHER PUBLICATIONS

Written Opinion issued in Application No. PCT/JP2015/076837 dated Dec. 28, 2015.

* cited by examiner

MULTILAYER SUBSTRATE

This is a continuation of International Application No. PCT/JP2015/076837 filed on Sep. 24, 2015 which claims priority from Japanese Patent Application No. 2014-200123 filed on Sep. 30, 2014. The contents of these applications are incorporated herein by reference in their entireties.

BACKGROUND

Technical Field

The present disclosure relates to a multilayer substrate including plural ceramic layers stacked on each other and a heat dissipating unit formed by via-conductors which pass through the ceramic layers.

A multilayer substrate may include a multilayer body constituted by plural ceramic layers stacked on each other, an electronic component disposed on or within the multilayer body, planar conductors disposed on the ceramic layers, and via-conductors passing through the ceramic layers (see, for example, Patent Documents 1 and 2).

During the manufacturing of the multilayer substrate, the via-conductors and the ceramic layers shrink, and due to a difference in the amount of shrinkage therebetween, the flatness of the surfaces of the substrate may be decreased. To address this problem, Patent Document 1 discloses the following technology. The diameter of the via-conductors which contact a mounting electrode of an electronic component is formed small so as to improve the flatness of the substrate for the mounting electrode.

Patent Document 2 discloses the following technology. To improve transmission characteristics of a signal transmission path when an electronic component having a high operating frequency is used, in a multilayer substrate, a via-conductor electrically connected to a mounting electrode of an electronic component branches into multiple rows of via-conductors.

Patent Document 1: Japanese Unexamined Patent Application Publication No. 2006-41242
Patent Document 2: Japanese Unexamined Patent Application Publication No. 2002-267781

BRIEF SUMMARY

In a multilayer substrate, to enhance heat dissipation from an electronic component, plural via-conductors may be disposed continuously in the stacking direction from a position at which they contact the electronic component. This also decreases the flatness of the surface of the multilayer substrate, and certain measures have to be taken for this.

The configuration disclosed in Patent Document 1 will be considered in terms of the heat dissipation. The via-conductors which contact the mounting electrode of the electronic component are formed smaller than usual via-conductors. This configuration limits the rate of heat flow at the via-conductors, and high heat dissipation characteristics may not be achieved. This configuration will also be considered in terms of the flatness. At the positions of the in-planar centers of the via-conductors, plural via-conductors are superposed on each other along the entire length (thickness) of the substrate. Hence, the surface of the substrate may protrude by an excessive amount, and a sufficient level of flatness may not be achieved.

The configuration disclosed in Patent Document 2 will be considered in terms of the heat dissipation. A planar conductor connecting via-conductors is interposed between a branching portion and a joining portion of the via-conductors. This configuration considerably limits the rate of heat flow at the planar conductor, and high heat dissipation characteristics may not be achieved.

The present disclosure provides a multilayer substrate that can achieve both high heat dissipation characteristics and high flatness characteristics.

The present disclosure provides a multilayer substrate including a plurality of ceramic layers stacked on each other in a stacking direction, a plurality of planar conductors disposed on surfaces of the ceramic layers, and a plurality of via-conductors passing through the ceramic layers. The multilayer substrate includes a component connecting unit connected to an electronic component, an external connecting unit connected to an external structure, and a heat dissipating unit. The heat dissipating unit includes a plurality of the via-conductors partially superposed on each other in the stacking direction. The via-conductors are disposed continuously between the component connecting unit and the external connecting unit and are electrically connected to the component connecting unit and the external connecting unit. The heat dissipating unit includes first and second communicating portions and a branching portion. In the first communicating portion, one via-conductor is disposed continuously from the component connecting unit per ceramic layer. In the second communicating portion, one via-conductor is disposed continuously from the external connecting unit per ceramic layer. In the branching portion, a plurality of the via-conductors is disposed continuously between the first and second communicating portions per ceramic layer. At a position at which the via-conductors of the branching portion and the via-conductor of the first communicating portion or the second communicating portion are adjacent to each other in the stacking direction, positions of centers of the adjacent via-conductors are separated from each other as viewed from the stacking direction.

At a boundary area between the communicating portion and the branching portion, a difference in the amount of shrinkage between the via-conductors and the ceramic layers becomes maximized at the central portions of the via-conductors. With the above-described configuration, the central portions of the via-conductors in this boundary area are not superposed on each other in the stacking direction but are separated from each other in the planar direction. Thus, the differences in the amounts of shrinkage do not accumulate in the stacking direction and do not become excessive. If the central portions of via-conductors are separated from each other in the planar direction, the rate of heat flow may be reduced. However, plural via-conductors are provided in the branching portion continuously between the first and second communicating portions. This configuration allows heat dissipation paths to be integrated together to maintain high heat dissipation characteristics. It is thus possible to implement a multilayer substrate having high heat dissipation characteristics and high flatness characteristics. An electronic component mounted on the multilayer substrate can also be supported in substantially parallel with an external substrate. A temperature rise in the electronic component can also be prevented (suppressed).

Within each of the first communicating portion, the second communicating portion, and the branching portion, positions of centers of the via-conductors adjacent to each other in the stacking direction may coincide with each other, as viewed from the stacking direction. With this configuration, within each of the first communicating portion, the second communicating portion, and the branching portion, a decrease in the amount of heat flow between the via-conductors can be prevented (suppressed).

At each position at which the via-conductors of the branching portion and the via-conductor of the first communicating portion or the second communicating portion are adjacent to each other in the stacking direction, a position of a center of one of the adjacent via-conductors may be separated from a position of a center of the other one of the adjacent via-conductors, as viewed from the stacking direction. With this configuration, deformation at the position of the center of one of the adjacent via-conductors is absorbed by the ceramic layer opposing this via-conductor during the manufacturing process, thereby significantly reducing the amount of deformation at the position of the center of this via-conductor.

The branching portion may be disposed along a plurality of the ceramic layers. This configuration can reduce the lengths of the first and second communicating portions in the stacking direction, thereby decreasing the amounts of deformation near the first and second communicating portions. The ceramic layers near the surfaces of the multilayer substrate produce a considerable influence on the flatness of the substrate. Reducing the amounts of deformation near the first and second communicating portions can effectively improve the flatness of the substrate. Deformation near the branching portion is likely to be absorbed by the ceramic layers near the surfaces of the multilayer substrate during the manufacturing process, and does not significantly impair the flatness of the multilayer substrate.

Fewer ceramic layers may be used to form the first communicating portion than ceramic layers used to form the second communicating portion. High flatness characteristics are demanded for the connecting surface of the substrate with an electronic component. The above-described configuration can achieve high flatness characteristics on this connecting surface.

The heat dissipating unit may include first and second branching portions and a third communicating portion. The first branching portion is disposed continuously from the component connecting unit with the first communicating portion interposed therebetween. The second branching portion is disposed continuously from the external connecting unit with the second communicating portion interposed therebetween. In the third communicating portion, one via-conductor is disposed continuously between the first and second branching portions per ceramic layer. This configuration can reduce the lengths of the first and second communicating portions in the stacking direction, thereby decreasing the amounts of deformation near the first and second communicating portions. Additionally, it is possible to adjust the flatness of the component connecting unit by the first branching portion and to adjust the flatness of the external connecting unit by the second branching portion.

The ceramic layers may include a dense area where the via-conductors are densely disposed and a sparse area where the via-conductors are sparsely disposed. The multilayer substrate may further include first and second heat dissipating units. In the first heat dissipating unit, the via-conductors in the dense area are disposed continuously. In the second heat dissipating unit, the via-conductors in the sparse area are disposed continuously. The first communicating portion of the first heat dissipating unit may be shorter than the first communicating portion of the second heat dissipating unit. In this configuration, the surface of the dense area is more likely to protrude than the surface of the sparse area. Thus, in the heat dissipating units included in the dense area and the sparse area, the lengths of the first communicating portions and the branching portions are adjusted, and more specifically, the length of the first communicating portion of the dense area is made shorter than that of the sparse area, so that the amounts of protrusion on the surfaces of the dense area and the sparse area can be uniform. As a result, an electronic component mounted along the dense area and the sparse area does not tilt or is less likely to tilt.

The ceramic layers may include a dense area where the via-conductors are densely disposed and a sparse area where the via-conductors are sparsely disposed. The branching portion may include first and second via-conductors. The first via-conductor is disposed in the dense area, as viewed from the stacking direction. The second via-conductor is disposed closer to the sparse area than the first via-conductor is, as viewed from the stacking direction. A cross-sectional area of the first via-conductor as viewed from the stacking direction may be smaller than a cross-sectional area of the second via-conductor as viewed from the stacking direction. In this configuration, in the branching portion, the cross-sectional area of the via-conductor disposed in the dense area and that of the via-conductor disposed closer to the sparse area than the first via-conductor is are adjusted, and more specifically, the cross-sectional area of the first via-conductor is made smaller than that of the second via-conductor, so that the amounts of protrusion on the surfaces of the dense area and the sparse area can be uniform. As a result, an electronic component mounted along the dense area and the sparse area does not tilt or is less likely to tilt.

In the branching portion, the plurality of via-conductors may be disposed symmetrically with each other, as viewed from the stacking direction. If a component connecting conductor is provided at a position opposing the branching portion, the flatness of the component connecting conductor is further enhanced.

According to the present disclosure, a heat dissipating unit can dissipate heat from an electronic component mounted on a multilayer substrate with high heat dissipation characteristics, and even by the provision of the heat dissipating unit, high flatness characteristics on the substrate can also be achieved. As a result, an electronic component mounted on the multilayer substrate does not tilt or is less likely to tilt.

DETAILED DESCRIPTION

Embodiments of the present disclosure will be described below with reference to FIGS. 1 through 7. In the individual drawings, conductive members are hatched by the solid lines, while insulating members are indicated by a pattern other than solid lines.

<<First Embodiment>>

Figure 1:
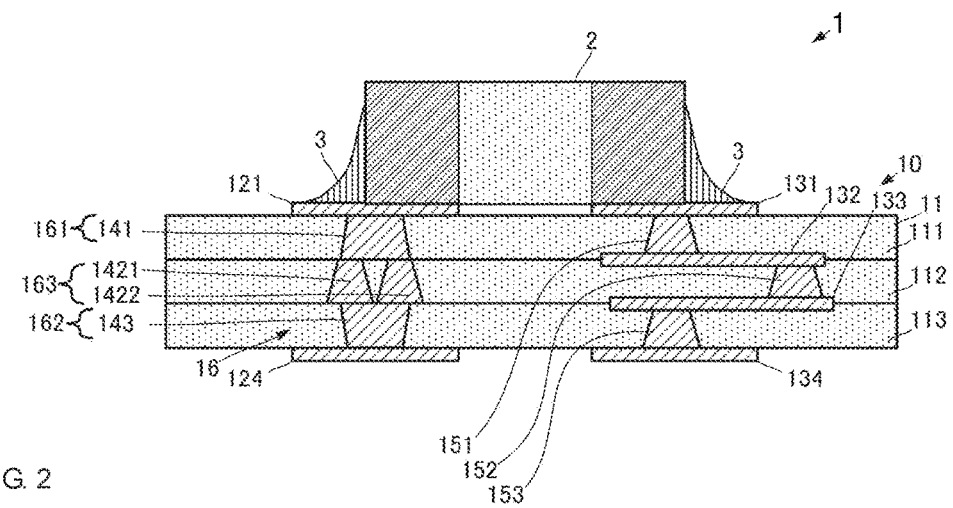
FIG. 1 is a side sectional view of a substrate module including a multilayer substrate according to a first embodiment.

A multilayer substrate according to a first embodiment of the present disclosure will be described below. FIG. 1 is a side sectional view of a substrate module 1 including a multilayer substrate 10 according to the first embodiment.

The substrate module 1 includes the multilayer substrate 10, an electronic component 2, and solder fillets 3. The electronic component 2 is a passive component, such as a capacitor, a coil, or a resistor chip, and is mounted on the surface of the multilayer substrate 10 by using the solder fillets 3. As the electronic component 2, instead of a passive element, a BGA (Ball Grid Allay) or SOP (Small Outline PACKAGE) active element (such as an IC chip) may be used. The electronic component 2 may be a component integrated within the multilayer substrate 10 or a component sealed in the multilayer substrate with a sealing resin. Examples of the electronic component 2 are a power amplifier (PA) and an elastic wave filter.

The multilayer substrate 10 includes a multilayer body 11, component mounting electrodes 121 and 131, external mounting electrodes 124 and 134, internal planar conductors 132 and 133, and via-conductors 141, 1421, 1422, 143, 151, 152, and 153.

The multilayer body 11 includes plural ceramic layers 111, 112, and 113. The multilayer body 11 is formed by stacking the ceramic layers 111, 112, and 113 in this order from one main surface to the other main surface.

The component mounting electrodes 121 and 131 are constituted by planar conductors provided on one main surface of the ceramic layer 111, that is, on one main surface of the multilayer body 11. The electronic component 2 is bonded to the component mounting electrodes 121 and 131 by using the solder fillets 3. The via-conductors 141 and 151 are provided by passing through the ceramic layer 111, which is one of the plural ceramic layers and is located on the side of one main surface of the multilayer body 11. The via-conductors 141 and 151 are electrically connected to the component mounting electrodes 121 and 131, respectively, at end portions of one main surface of the ceramic layer 111.

The internal planar conductor 132 is positioned within the multilayer body 11, and is constituted by a planar conductor provided on one main surface of the ceramic layer 112, that is, at the interface between the ceramic layers 111 and 112. The end portion of the via-conductor 151 on the other main surface of the ceramic layer 111 is electrically connected to the internal planar conductor 132. The via-conductors 1421, 1422, and 152 are provided by passing through the ceramic layer 112. At the end portions of one main surface of the ceramic layer 112, the via-conductors 1421 and 1422 are electrically connected to the via-conductor 141 and the via-conductor 152 is electrically connected to the internal planar conductor 132.

The internal planar conductor 133 is positioned within the multilayer body 11, and is constituted by a planar conductor provided on one main surface of the ceramic layer 113, that is, at the interface between the ceramic layers 112 and 113. The end portion of the via-conductor 152 on the other main surface of the ceramic layer 112 is electrically connected to the internal planar conductor 133. The via-conductors 143 and 153 are provided by passing through the ceramic layer 113. At the end portions of one main surface of the ceramic layer 113, the via-conductor 143 is electrically connected to the via-conductors 1421 and 1422 and the via-conductor 153 is electrically connected to the internal planar conductor 133. The external mounting electrodes 124 and 134 are constituted by planar conductors provided on the other main surface of the ceramic layer 113, that is, on the other main surface of the multilayer body 11. The end portions of the via-conductors 143 and 153 on the other main surface of the ceramic layer 113 are electrically connected to the external mounting electrodes 124 and 134, respectively.

The via-conductors 141, 1421, 1422, and 143 are disposed continuously between the component mounting electrode 121 and the external mounting electrode 124 and electrically connect the component mounting electrode 121 and the external mounting electrode 124. The via-conductors 151, 152, and 153 and the internal planar conductors 132 and 133 are disposed continuously between the component mounting electrode 131 and the external mounting electrode 134 and electrically connect the component mounting electrode 131 and the external mounting electrode 134.

The via-conductors 141, 1421, 1422, and 143 are disposed such that via-conductors adjacent to each other in the stacking direction (a direction perpendicular to the one main surface of the ceramic layer 111) are superposed on each other as viewed from above. Consequently, a high rate of heat flow is obtained between the adjacent via-conductors 141, 1421, 1422, and 143. The via-conductors 141, 1421, 1422, and 143 thus serve to transfer heat generated in the electronic component 2 from the component mounting electrode 121 to the external mounting electrode 124 so as to dissipate heat to an external structure. An example of the external structure is a circuit substrate on which the multilayer substrate is mounted.

The via-conductors 141, 1421, 1422, and 143 form "a heat dissipating unit" 16 recited in the claims. The component mounting electrode 121 corresponds to "a component connecting unit" recited in the claims. The external mounting electrode 124 corresponds to "an external connecting unit" recited in the claims.

A portion of the heat dissipating unit 16 in which the via-conductor 141 is provided is an area where a single via-conductor is disposed continuously from the component mounting electrode 121 per ceramic layer, and forms "a first communicating portion" 161 recited in the claims. A portion of the heat dissipating unit 16 in which the via-conductor 143 is provided is an area where a single via-conductor is disposed continuously from the external mounting electrode 124 per ceramic layer, and forms "a second communicating portion" 162 recited in the claims. A portion of the heat dissipating unit 16 in which the via-conductors 1421 and 1422 are provided is an area where plural via-conductors are disposed continuously between the first and second communicating portions 161 and 162 per ceramic layer, and forms "a branching portion" 163 recited in the claims.

Figure 2:
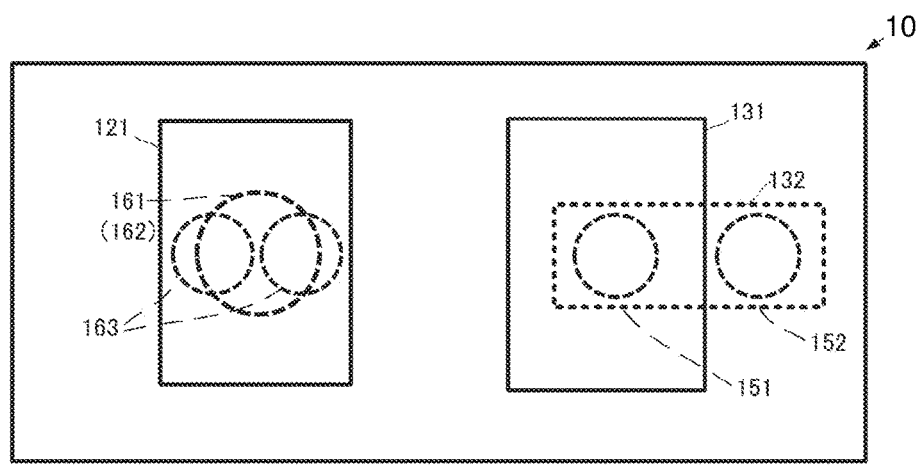
FIG. 2 is a plan view of the multilayer substrate according to the first embodiment.

FIG. 2 is a plan view of the multilayer substrate 10 as viewed from one main surface of the multilayer substrate 10. The plural via-conductors (141 and 143) respectively forming the first and second communicating portions 161 and 162 have the same configuration, that is, the same circular configuration, and are also superposed on each other in a planar direction. Concerning the via-conductors (1421 and 1422) forming the branching portion 163, as viewed from one main surface of the multilayer substrate 10, the positions of the centers thereof as viewed from the stacking direction are separated from the positions of the centers of the via-conductors (141 and 143) forming the first and second communicating portions 161 and 162. The center is the centroid of a via-conductor as viewed from the stacking direction. As viewed from one main surface of the multilayer substrate 10, the positions of the centers of the via-conductors (1421 and 1422) forming the branching portion 163 are all separated from the positions of the centers of the via-conductors (141 and 143) forming the first and second communicating portions 161 and 162. The via-conductors (1421 and 1422) forming the branching portion 163 have the same planar configuration and are disposed symmetrically with each other with respect to the position of the center of the via-conductors (141 and 143) forming the first and second communicating portions. The via-conductors (1421 and 1422) are partially superposed on the via-conductors (141 and 143) forming the first and second communicating portions 161 and 162.

In the multilayer substrate 10 configured as described above, the positions of the centers of adjacent via-conductors (141 and 1421 or 141 and 1422) in the first communicating portion 161 and the branching portion 163 as viewed from the stacking direction are separated from each other. The cross-sectional area of the connecting portion between these via-conductors (141 and 1421 or 141 and 1422) is relatively small, and it is thus difficult to obtain a high rate of heat flow from the connecting portion between these via-conductors (141 and 1421 or 141 and 1422). To address this problem, in the branching portion 163, the plural via-conductors (1421 and 1422) are provided in the single ceramic layer 112 and are disposed continuously from the via-conductor (141) forming the first communicating portion 161. With this configuration, the cross-sectional area of the connecting portion between the branching portion 163 and the first communicating portion 161 is increased, and a high rate of heat flow can be obtained in this connecting portion. The plural via-conductors (1421 and 1422) in the branching portion 163 are also disposed continuously from the via-conductor (143) forming the second communicating portion 162. With this configuration, the cross-sectional area of the connecting portion between the branching portion 163 and the second communicating portion 162 is increased, and a high rate of heat flow can also be obtained in this connecting portion. As a result, the multilayer substrate 10 achieves high heat dissipation characteristics so as to prevent (suppress) a temperature rise in the electronic component 2 mounted on the multilayer substrate 10.

The multilayer substrate 10 configured as described above is manufactured by the following process. Ceramic green sheets are formed from a paste in which ceramic powder is mixed with a binder material and a solvent. Then, via-holes, etc. are formed in each ceramic green sheet. Then, by printing on each ceramic green sheet with a conductive paste in which conductive material powder is mixed with a binder material and a solvent or by charging this conductive paste into the via-holes of each ceramic green sheet, planar conductors and via-conductors are formed. Thereafter, the plural ceramic green sheets are stacked on each other with pressure and are fired at about 1000° C., so that the ceramic green sheets are sintered. As a result, the multilayer body 11 having the ceramic layers 111, 112, and 113 stacked on each other is formed, that is, the multilayer substrate 10 is formed.

Due to this manufacturing process, while the ceramic green sheets and the conductive paste are being heat-treated, vaporization of solvent components or burnout of binder components occurs. While being subjected to heat treatment, the ceramic layers 111, 112, and 113 and the via-conductors 141, 1421, 1422, 143, 151, 152, and 153 shrink. Because of a difference in the amount of shrinkage between the ceramic layers 111, 112, and 113 and the via-conductors 141, 1421, 1422, 143, 151, 152, and 153, tiny projections and depressions are produced in the surface configuration of the multilayer substrate 10 in the stacking direction.

Figure 3A:
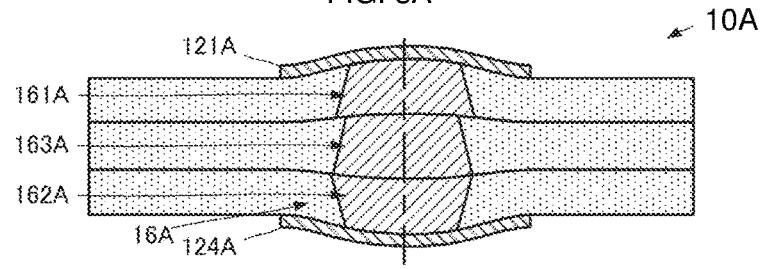
FIGS. 3A and 3B show views for explaining the surface configurations of multilayer substrates.
Figure 3B:
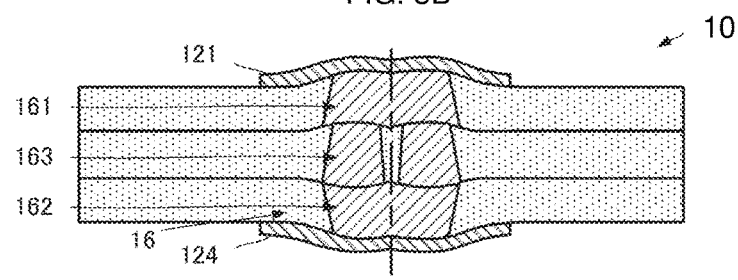

Projections and depressions in the surface configuration of the multilayer substrate produced near the heat dissipating unit in an embodiment of the present disclosure and those in a comparative example are shown. FIG. 3A is a side-sectional view schematically illustrating the surface configuration of a multilayer substrate 10A according to a comparative example. FIG. 3B is a side-sectional view schematically illustrating the surface configuration of the multilayer substrate 10 according to the embodiment. In FIGS. 3A and 3B, the projections and depressions in the surface configuration are exaggerated for representation.

In the multilayer substrate 10A according to the comparative example, via-conductors 161A, 162A, and 163A forming a heat dissipating unit 16A are almost entirely superposed on each other in the stacking direction. The positions of the centers of the via-conductors 161A, 162A, and 163A also almost coincide with each other. In contrast, in the multilayer substrate 10 according to the embodiment, the heat dissipating unit 16 includes the first and second communicating portions 161 and 162 and the branching portion 163. The positions of the centers of the via-conductors forming the branching portion 163 are separated from the position of the center of the via-conductor forming each of the first and second communicating portions 161 and 162.

In the multilayer substrate 10A according to the comparative example, due to a difference in the amount of shrinkage occurring during the manufacturing of the multilayer substrate 10A, the central portions of the via-conductors become thicker than the other portions in the ceramic layers. The positions of the centers of all the via-conductors 161A, 162A, and 163A (indicated by the long dashed dotted line in FIGS. 3A and 3B) almost coincide with each other in the stacking direction. Thus, the increased thicknesses of all the via-conductors 161A, 162A, and 163A simply accumulate, thereby making the amount of protrusion on the surface of the multilayer substrate 10A excessive.

In contrast, in the multilayer substrate 10 according to the embodiment, although, as in the comparative example, the central portions of the via-conductors become thicker than the other portions in the ceramic layers, the positions of the centers of the via-conductors forming the branching portion 163 are separated from the positions of the centers of the communicating portions 161 and 162 in a planar direction. This configuration can reduce the amount of protrusion on the surfaces of the first and second communicating portions 161 and 162 at the positions of the centers of the via-conductors (indicated by the long dashed dotted line in FIGS. 3A and 3B).

As described above, in the multilayer substrate 10 according to this embodiment, by disposing the branching portion 163 in the heat dissipating unit 16, the amounts of protrusion on one and the other main surfaces of the multilayer substrate 10 opposing the heat dissipating unit 16 can be reduced. It is thus possible to enhance the flatness of the component mounting electrode 121 and the external mounting electrode 124 disposed at positions at which they oppose the heat dissipating unit 16.

<<Second Embodiment>>

Figure 4:
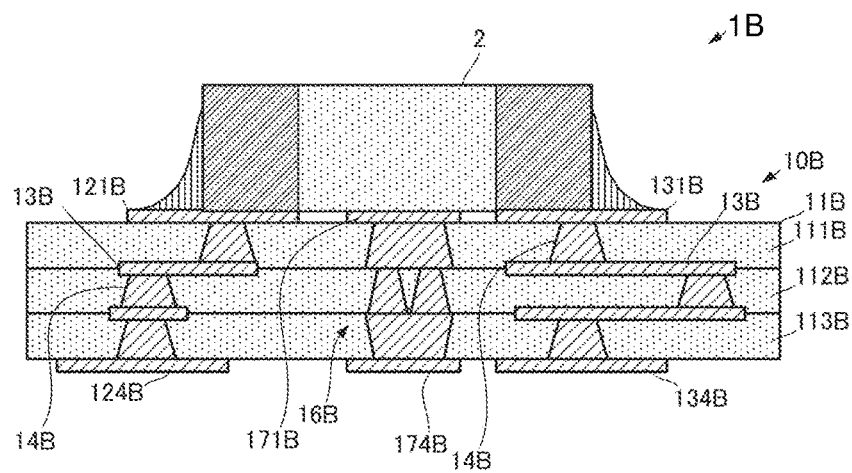
FIG. 4 is a side-sectional view illustrating a substrate module including a multilayer substrate according to a second embodiment.

A multilayer substrate according to a second embodiment of the present disclosure will now be described below. FIG. 4 is a side-sectional view illustrating a substrate module 1B including a multilayer substrate 10B according to the second embodiment.

The multilayer substrate 10B includes a multilayer body 11B, component mounting electrodes 121B and 131B, external mounting electrodes 124B and 134B, internal planar conductors 13B, and via-conductors 14B.

In the multilayer substrate 10B, in addition to the via-conductors 14B disposed continuously between the component mounting electrode 121B and the external mounting electrode 124B and the via-conductors 14B disposed continuously between the component mounting electrode 131B and the external mounting electrode 134B, a component connecting conductor 171B, an external connecting conductor 174B, and a heat dissipating unit 16B are provided. The component connecting conductor 171B, the external connecting conductor 174B, and the heat dissipating unit 16B are not electrically connected to the terminal electrode of the electronic component 2 and are thus electrically independent of the electronic component 2. The component connecting conductor 171B, the external connecting conductor 174B, and the heat dissipating unit 16B serve only to dissipate heat from the electronic component 2.

The multilayer substrate according to the present disclosure may be configured in this manner.

<<Third Embodiment>>

Figure 5:
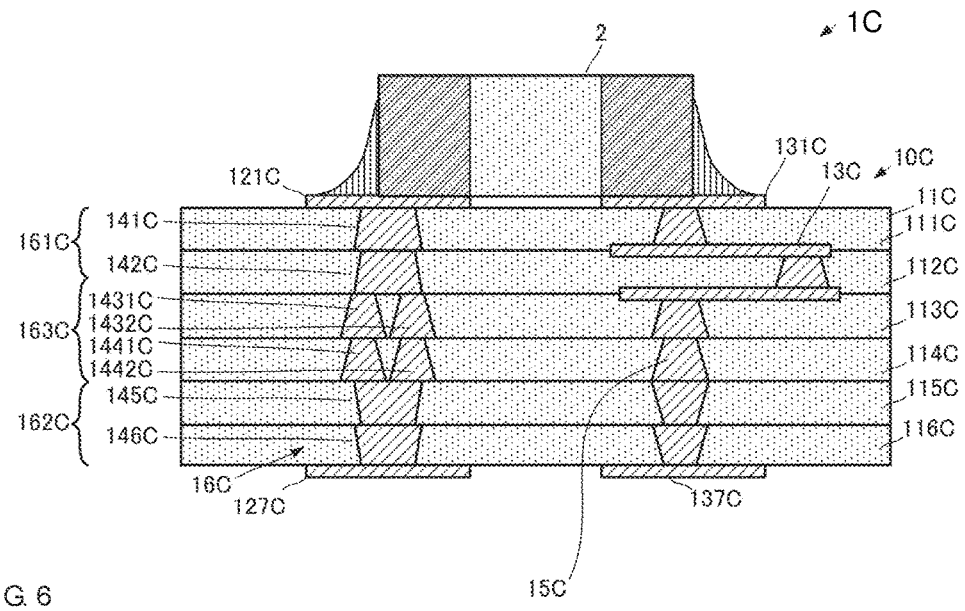
FIG. 5 is a side-sectional view illustrating a substrate module including a multilayer substrate according to a third embodiment.

A multilayer substrate according to a third embodiment of the present disclosure will now be described below. FIG. 5 is a side-sectional view illustrating a substrate module 1C including a multilayer substrate 10C according to the third embodiment.

The multilayer substrate 10C includes a multilayer body 11C, component mounting electrodes 121C and 131C, external mounting electrodes 127C and 137C, internal planar conductors 13C, and via-conductors 15C, 141C, 142C, 1431C, 1432C, 1441C, 1442C, 145C, and 146C.

The multilayer body 11C includes plural ceramic layers 111C, 112C, 113C, 114C, 115C, and 116C. The multilayer body 11C is formed by stacking the ceramic layers 111C, 112C, 113C, 114C, 115C, and 116C in this order from one main surface to the other main surface.

In this embodiment, the via-conductors 141C, 142C, 1431C, 1432C, 1441C, 1442C, 145C, and 146C are disposed such that via-conductors adjacent to each other in the stacking direction are superposed on each other as viewed from above. The via-conductors 141C, 142C, 1431C, 1432C, 1441C, 1442C, 145C, and 146C form "a heat dissipating unit" 16C recited in the claims. The single via-conductor 141C is provided in the ceramic layer 111C and the single via-conductor 142C is provided in the ceramic layer 112C, and the via-conductors 141C and 142C are disposed continuously from the component mounting electrode 121C. The via-conductors 141C and 142C form "a first communicating portion" 161C recited in the claims. The single via-conductor 145C is provided in the ceramic layer 115C and the single via-conductor 146C is provided in the ceramic layer 116C, and the via-conductors 145C and 146C are disposed continuously from the external mounting electrode 126C. The via-conductors 145C and 146C form "a second communicating portion" 162C recited in the claims. The two via-conductors 1431C and 1432C are provided in the ceramic layer 113C and the two via-conductors 1441C and 1442C are provided in the ceramic layer 114C. The via-conductors 1431C, 1432C, 1441C, and 1442C are disposed continuously between the first and second communicating portions 161C and 162C, and form "a branching portion" 163C recited in the claims.

As described above, in this embodiment, each of the first communicating portion 161C, the second communicating portion 162C, and the branching portion 163C is disposed along the plural ceramic layers. Within each of the first communicating portion 161C, the second communicating portion 162C, and the branching portion 163C, the positions of the centers of adjacent via-conductors coincide with each other, as viewed from the stacking direction. This configuration makes it possible to obtain a high rate of heat flow within each of the first communicating portion 161C, the second communicating portion 162C, and the branching portion 163C.

In each of the first communicating portion 161C, the second communicating portion 162C, and the branching portion 163C, although the positions of the centers of adjacent via-conductors coincide with each other, they may be slightly displaced from each other.

<<Fourth Embodiment>>

Figure 6:
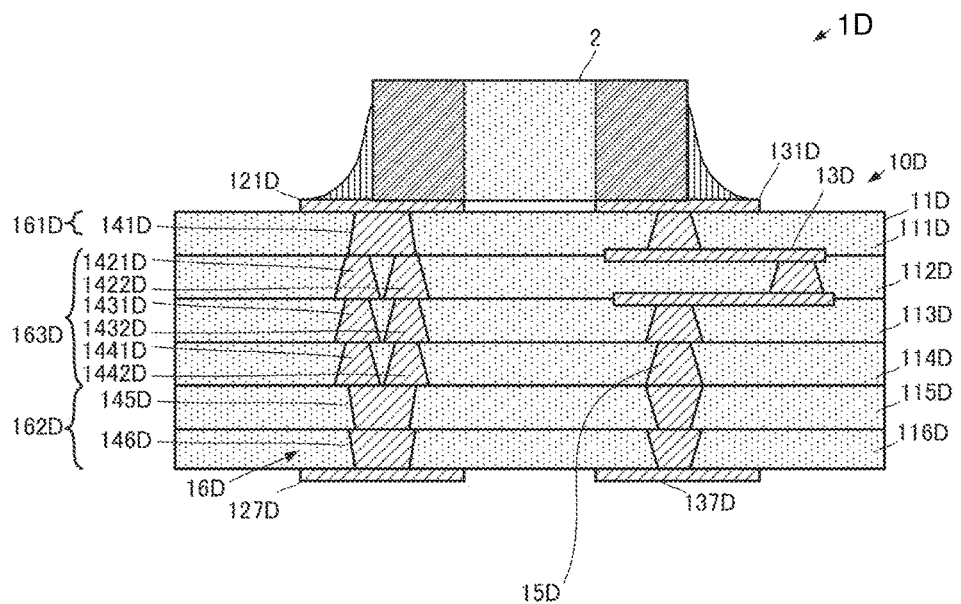
FIG. 6 is a side-sectional view illustrating a substrate module including a multilayer substrate according to a fourth embodiment.

A multilayer substrate according to a fourth embodiment of the present disclosure will now be described below. FIG. 6 is a side-sectional view illustrating a substrate module 1D including a multilayer substrate 10D according to the fourth embodiment.

The multilayer substrate 10D includes a multilayer body 11D, component mounting electrodes 121D and 131D, external mounting electrodes 127D and 137D, internal planar conductors 13D, and via-conductors 15D, 141D, 1421D, 1422D, 1431D, 1432D, 1441D, 1442D, 145D, and 146D.

In this embodiment, the two via-conductors 1421D and 1422D are provided in the ceramic layer 112D, which is the second layer, in the multilayer body 11D, and are also disposed continuously in a branching portion 163D. In this manner, more ceramic layers are used to form the branching portion 163D, and fewer ceramic layers are used to form a first communicating portion 161D. This configuration makes is possible to reduce the amount of deformation produced near the first communicating portion 161D, thereby contributing to an improvement in the flatness on one main surface of the ceramic layer 111D in which the first communicating portion 161D is formed, that is, on one main surface of the multilayer body 10D. The amount of deformation produced in the ceramic layers 112D through 114D in which the branching portion 163D is formed is increased. However, such deformation is likely to be absorbed in the ceramic layer 111D near the surfaces of the multilayer substrate 10D, and does not significantly impair the flatness of the multilayer substrate 10D.

In this embodiment, the first communicating portion 161D is provided in the ceramic layer 111D, while a second communicating portion 162D is provided in the ceramic layers 115D and 116D. Fewer ceramic layers are used to form the first communicating portion 161D than those used to form the second communicating portion 162D. With this configuration, the flatness on one main surface of the multilayer substrate 10D is improved to a higher level than that of the other main surface of the multilayer substrate 10D. The electronic component 2 can thus be mounted on the mounting surface having higher flatness characteristics.

<<Fifth Embodiment>>

Figure 7:
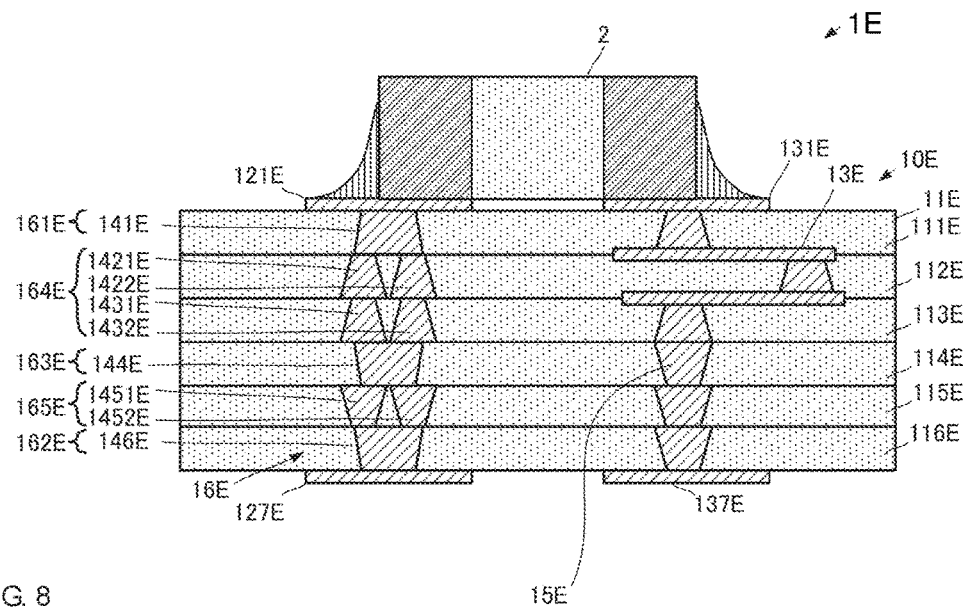
FIG. 7 is a side-sectional view illustrating a substrate module including a multilayer substrate according to a fifth embodiment.

A multilayer substrate according to a fifth embodiment of the present disclosure will now be described below. FIG. 7 is a side-sectional view illustrating a substrate module 1E including a multilayer substrate 10E according to the fifth embodiment.

The multilayer substrate 10E includes a multilayer body 11E, component mounting electrodes 121E and 131E, external mounting electrodes 127E and 137E, internal planar conductors 13E, and via-conductors 15E, 141E, 1421E, 1422E, 1431E, 1432E, 144E, 1451E, 1452E, and 146E.

In this embodiment, the two via-conductors 1421E and 1422E are provided in the second ceramic layer 112E of the multilayer body 11E and the two via-conductors 1431E and 1432E are provided in the third ceramic layer 113E of the multilayer body 11E so as to form a first branching portion 164E. The two via-conductors 1451E and 1452E are provided in the fifth ceramic layer 115E of the multilayer body 11E so as to form a second branching portion 165E. Then, the single via-conductor 144E is provided at a position between the first and second branching portions 164E and 165E, that is, in the fourth ceramic layer 114E, so as to form a third communicating portion 163E.

With this configuration, it is possible to decrease the number of ceramic layers in which the first branching portion 164E is provided and that in which the second branching portion 165E is provided. The amounts of deformation produced near the first and second branching portions 164E and 165E can thus be reduced. The number of ceramic layers used to form the first branching portion 164E and that used to form the second branching portion 165E may be adjusted so that they can be different from each other. Then, the flatness of one main surface of the multilayer substrate 10E and that of the other main surface can be adjusted independently of each other. For example, the flatness of one main surface of the multilayer substrate 10E is adjusted by the first branching portion 164E, while the flatness of the other main surface of the multilayer substrate 10E is adjusted by the second branching portion 165E.

Figure 8:
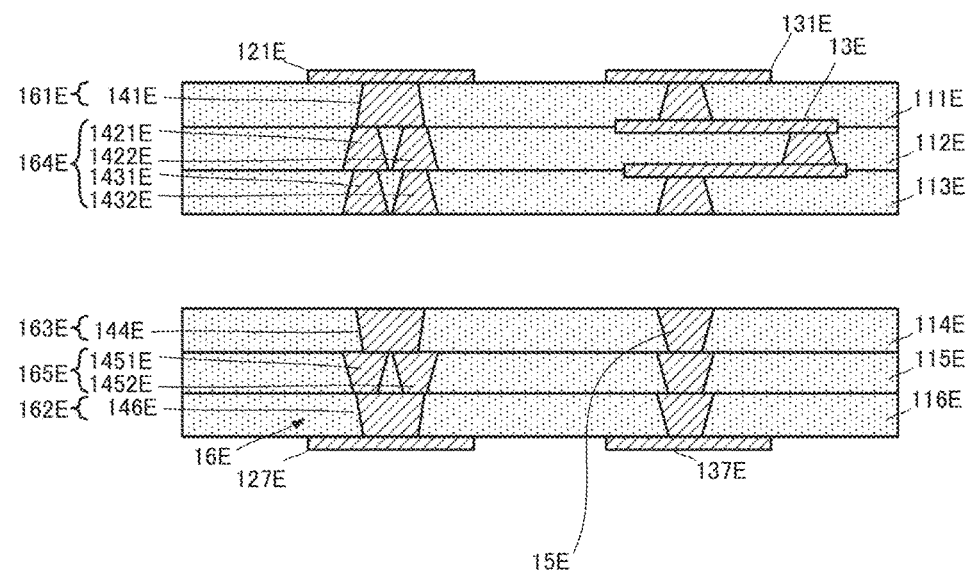
FIG. 8 is a view illustrating a state of the multilayer substrate according to the fifth embodiment in a manufacturing process.

FIG. 8 illustrates a state of the above-configured multilayer substrate 10E in a manufacturing process. In the manufacturing process of the multilayer substrate 10E, as shown in FIG. 8, ceramic green sheets which will form the ceramic layers 111E, 112E, and 113E on the side of one main surface of the multilayer substrate 10E are stacked on each other with pressure while adjusting the flatness of one main surface of the ceramic layer 111E, thereby forming a first ceramic green sheet multilayer body. Ceramic green sheets which will form the ceramic layers 114E, 115E, and 116E on the side of the other main surface of the multilayer substrate 10E are stacked on each other with pressure while adjusting the flatness of the other main surface of the ceramic layer 111E, thereby forming a second ceramic green sheet multilayer body. Then, the first and second ceramic green sheet multilayer bodies are pressure-bonded to each other, and the bonded multilayer body is fired at about 1000° C. so that the ceramic green sheets are sintered. In this manufacturing process, the flatness of both the main surfaces of the multilayer substrate 10E can be adjusted precisely.

<<Sixth Embodiment>>

Figure 9:
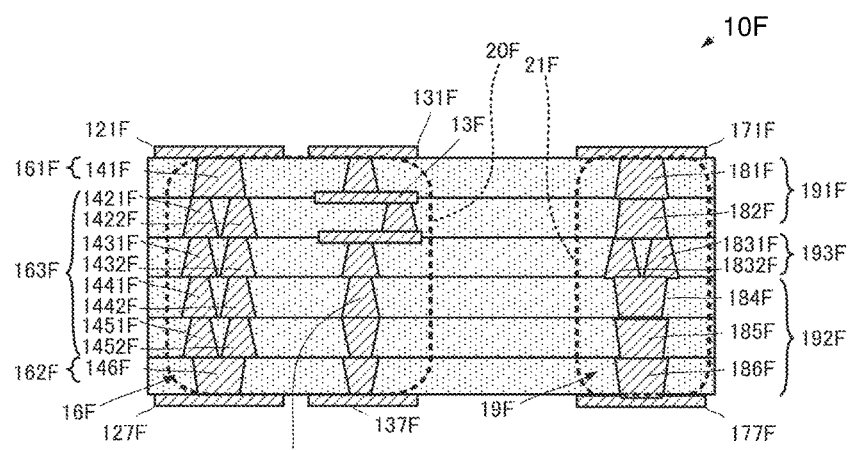
FIG. 9 is a side-sectional view illustrating a multilayer substrate according to a sixth embodiment.

A multilayer substrate according to a sixth embodiment of the present disclosure will now be described below. FIG. 9 is a side-sectional view illustrating a multilayer substrate 10F according to the sixth embodiment.

The multilayer substrate 10F includes a multilayer body 11F, component mounting electrodes 121F, 131F, and 171F, external mounting electrodes 127F, 137F, 177F, internal planar conductors 13F, and via-conductors 15F, 141F, 1421F, 1422F, 1431F, 1432F, 1441F, 1442F, 145F, 146F, 181F, 182F, 1831F, 1832F, 184F, 185F, and 186F.

In this embodiment, the multilayer substrate 10F includes first and second heat dissipating units 16F and 19F. The first heat dissipating unit 16F is formed by continuously providing the via-conductors 141F, 1421F, 1422F, 1431F, 1432F, 1441F, 1442F, 145F, and 146F between the component mounting electrode 121F and the external mounting electrode 127F. The second dissipating unit 19F is formed by continuously providing the via-conductors 181F, 182F, 1831F, 1832F, 184F, 185F, and 186F between the component mounting electrode 171F and the external mounting electrode 177F.

The first heat dissipating unit 16F includes a first communicating portion 161F constituted by the via-conductor 141F, a branching portion 163F constituted by the via-conductors 1421F, 1422F, 1431F, 1432F, 1441F, 1442F, 1451F, and 1452F, and a second communicating portion 162F constituted by the via-conductor 146F. The second heat dissipating unit 19F includes a first communicating portion 191F constituted by the via-conductors 181F and 182F, a branching portion 193F constituted by the via-conductors 1831F and 1832F, and a second communicating portion 192F constituted by the via-conductors 184F, 185F, and 186F.

In this embodiment, the multilayer body 111F may be divided into a dense area 20F where via-conductors densely disposed and a sparse area 21F where via-conductors are sparsely disposed. In the dense area 20F, the first heat dissipating unit 16F and the via-conductors 15F continuously provided between the component mounting electrode 131F and the external mounting electrode 137F are disposed. In the sparse area 21F, the second heat dissipating unit 19F is disposed.

In this configuration, the surface of the dense area 20F where via-conductors are densely disposed is more likely to protrude than the surface of the sparse area 21F where via-conductors are sparsely disposed. Thus, in the first and second heat dissipating units 16F and 19F included in the dense area 20F and the sparse area 21F, respectively, the lengths of the first communicating portions 161F and 191F and the branching portions 163F and 193F are adjusted so that the amounts of protrusion on the surfaces of the dense area 20F and the sparse area 21F can be uniform.

For example, in the dense area 20F where the amount of protrusion is likely to be relatively large, the first heat dissipating unit 16F is configured such that the branching portion 163F is long in the stacking direction and the first communicating portion 161F is short in the stacking direction. Then, the amount of protrusion on the surface of the dense area 20F can be reduced. In contrast, in the sparse area 21F where the amount of protrusion is likely to be relatively small, the second heat dissipating unit 19F is configured such that the branching portion 193F is short in the stacking direction and the first communicating portion 191F is long in the stacking direction. Then, the amount of protrusion on the surface of the sparse area 21F can be increased.

Hence, the amount of protrusion of the component mounting electrode 121F disposed on the surface of the dense area 20F and that of the component mounting electrode 171F disposed on the sparse area 21F can be made uniform. Then, a single electronic component, which is mounted along the component mounting electrodes 121F and 171F, can be disposed in parallel with one main surface of the multilayer substrate 10F. The bonding state between the terminal electrode of the electronic component and the component mounting electrodes 121F and 171F can thus be improved, and a bonding failure in the electronic component is less likely to occur.

<<Seventh Embodiment>>

Figure 10:
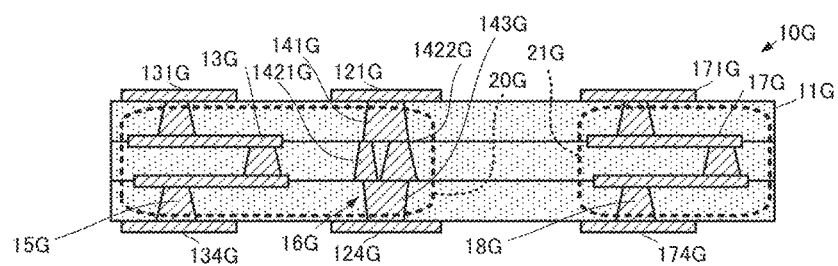
FIG. 10 is a side-sectional view illustrating a multilayer substrate according to a seventh embodiment.

A multilayer substrate according to a seventh embodiment of the present disclosure will now be described below. FIG. 10 is a side-sectional view illustrating a multilayer substrate 10G according to the seventh embodiment.

The multilayer substrate 10G includes a multilayer body 11G, component mounting electrodes 121G, 131G, and 171G, external mounting electrodes 123G, 133G, 173G, internal planar conductors 13G and 17G, and via-conductors 15G, 18G, 141G, 1421G, 1422G, and 143G.

In this embodiment, the multilayer body 111G may be divided into a dense area 20G where via-conductors densely disposed and a sparse area 21G where via-conductors are sparsely disposed. In the dense area 20G, a heat dissipating unit 16G and the via-conductors 15G continuously provided between the component mounting electrode 131G and the external mounting electrode 134G are disposed. In the sparse area 21G, the via-conductors 18G continuously provided between the component mounting electrode 171G and the external mounting electrode 174G are disposed. In this configuration, the surface of the dense area 20G where via-conductors are densely disposed is more likely to protrude than the surface of the sparse area 21G where via-conductors are sparsely disposed.

In the heat dissipating unit 16G, concerning the via-conductors 1421G and 1422G forming a branching portion, the via-conductor 1421G is disposed closer to the center of the dense area 20G than the via-conductor 1422G is, and the via-conductor 1422G is disposed closer to the sparse area 21G than the via-conductor 1421G is. The cross-sectional areas of the via-conductors 1421G and 1422G as viewed from one main surface are adjusted so that the amounts of protrusion on the surfaces of the dense area 20G and the sparse area 21G can be uniform.

For example, the dense area 20G where the amount of protrusion is likely to be relatively large is considerably influenced by the via-conductor 1421G disposed closer to the center of the dense area 20G than the via-conductor 1422G is. The cross-sectional area of the via-conductor 1421G is thus decreased so that the amount of protrusion on the surface of the dense area 20G can be reduced. In contrast, the sparse area 21G where the amount of protrusion is likely to be relatively small is considerably influenced by the via-conductor 1422G disposed closer to the sparse area 21G than the via-conductor 1421G is. The cross-sectional area of the via-conductor 1421G is thus increased so that the amount of protrusion on the surface of the sparse area 21G can be increased.

Hence, the amount of protrusion of the component mounting electrode 121G disposed on the surface of the dense area 20G and that of the component mounting electrode 171G disposed on the sparse area 21G can be made uniform. Then, a single electronic component, which is mounted along the component mounting electrodes 121G and 171G, can be disposed in parallel with one main surface of the multilayer substrate 10G. The bonding state between the terminal electrode of the electronic component and the component mounting electrodes 121G and 171G can thus be improved, and a bonding failure in the electronic component is less likely to occur.

The multilayer substrate of the present disclosure can be formed and configured as described in the embodiments. However, the present disclosure can be carried out in various modes other than those in the above-described embodiments within the scope of the claims. For example, although the heat dissipating unit is constituted only by via-conductors in the above-described embodiments, it may be constituted by a combination of via-conductors and planar conductors. In this configuration, too, if adjacent via-conductors in the stacking direction are at least partially superposed on each other in the stacking direction, the present disclosure can suitably be carried out.

REFERENCE SIGNS LIST 1 substrate module
2 electronic component
3 fillet
10 multilayer substrate
11 multilayer body
16 heat dissipating unit
111, 112, 113 ceramic layer
121, 131 component mounting electrode
124, 134 external mounting electrode
132, 133 internal planar conductor
141, 1421, 1422, 143, 151, 152, 153 via-conductor
161 first communicating portion
162 second communicating portion
163 branching portion

The invention claimed is:

1. A multilayer substrate comprising:
a plurality of ceramic layers stacked on each other in a stacking direction;
a plurality of planar conductors disposed on surfaces of the ceramic layers;
a plurality of via-conductors passing through the ceramic layers;
a component connecting unit connected to an electronic component;
an external connecting unit connected to an external structure; and
a heat dissipating unit including the plurality of the via-conductors partially superposed on each other in the stacking direction, the via-conductors being disposed continuously between the component connecting unit and the external connecting unit and being electrically connected to the component connecting unit and the external connecting unit,
the heat dissipating unit including
a first communicating portion in which one via-conductor is disposed continuously from the component connecting unit per ceramic layer,
a second communicating portion in which one via-conductor is disposed continuously from the external connecting unit per ceramic layer, and
a branching portion in which the plurality of the via-conductors are disposed continuously between the first and second communicating portions per ceramic layer,
wherein, at a position at which the via-conductors of the branching portion and the via-conductor of the first communicating portion or the second communicating portion are adjacent to each other in the stacking direction, positions of centers of the adjacent via-conductors are separated from each other as viewed from the stacking direction,
a diameter of a first surface of the first communicating portion is larger than a diameter of a second surface of the first communication portion, the first surface of the first communicating portion being a surface connected to the branching portions, the second surface of the first communicating portion being a surface connected to the component connecting unit, and a diameter of a first surface of the second communicating portion is larger than a diameter of a second surface of the second communication portion, the first surface of the second communicating portion being a surface connected to the branching portions, the second surface of the second communicating portion being a surface connected to the external connecting unit.

2. The multilayer substrate according to claim 1, wherein, within each of the first communicating portion, the second communicating portion, and the branching portion, positions of centers of the via-conductors adjacent to each other in the stacking direction coincide with each other, as viewed from the stacking direction.

3. The multilayer substrate according to claim 2, wherein, at each position at which the via-conductors of the branching portion and the via-conductor of the first communicating portion or the second communicating portion are adjacent to each other in the stacking direction, a position of a center of one of the adjacent via-conductors is separated from a position of a center of the other one of the adjacent via-conductors, as viewed from the stacking direction.

4. The multilayer substrate according to claim 2, wherein the branching portion is disposed along the plurality of the ceramic layers.

5. The multilayer substrate according to claim 2, wherein fewer number of ceramic layers are comprised in the first communicating portion than a number of the ceramic layers comprised in the second communicating portion.

6. The mutilayer substrate according to claim 2, wherein the heat dissipating unit includes
a first branching portion disposed continuously from the component connecting unit with the first communicating portion interposed therebetween,
a second branching portion disposed continuously from the external connecting unit with the second communicating portion interposed therebetween, and
a third communicating portion in which one via-conductor is disposed continuously between the first and second branching portions per ceramic layer.

7. The multilayer substrate according to claim 2, wherein the ceramic layers include
a first area where a plurality of the via-conductors are disposed, and
a second area where a plurality of the via-conductors are disposed,
wherein fewer number of the via-conductors are disposed in the second area than the first area,
the multilayer substrate further comprising:
a first heat dissipating unit in which the via-conductors in the first area are disposed continuously; and
a second heat dissipating unit in which the via-conductors in the second area are disposed continuously,
wherein the first communicating portion of the first heat dissipating unit is shorter than the first communicating portion of the second heat dissipating unit.

8. The multilayer substrate according to claim 1, wherein, at each position at which the via-conductors of the branching portion and the via-conductor of the first communicating portion or the second communicating portion are adjacent to each other in the stacking direction, a position of a center of one of the adjacent via-conductors is separated from a position of a center of the other one of the adjacent via-conductors, as viewed from the stacking direction.

9. The multilayer substrate according to claim 8, wherein the branching portion is disposed along the plurality of the ceramic layers.

10. The multilayer substrate according to claim 8, wherein fewer number of ceramic layers are comprised in the first communicating portion than a number of the ceramic layers comprised in the second communicating portion.

11. The multilayer substrate according to claim 8, wherein the heat dissipating unit includes
a first branching portion disposed continuously from the component connecting unit with the first communicating portion interposed therebetween,
a second branching portion disposed continuously from the external connecting unit with the second communicating portion interposed therebetween, and
a third communicating portion in which one via-conductor is disposed continuously between the first and second branching portions per ceramic layer.

12. The multilayer substrate according to claim 1, wherein the branching portion is disposed along the plurality of the ceramic layers.

13. The multilayer substrate according to claim 12, wherein fewer number of ceramic layers are comprised in the first communicating portion than a number of the ceramic layers comprised in the second communicating portion.

14. The multilayer substrate according to claim 12, wherein the heat dissipating unit includes
a first branching portion disposed continuously from the component connecting unit with the first communicating portion interposed therebetween,
a second branching portion disposed continuously from the external connecting unit with the second communicating portion interposed therebetween, and
a third communicating portion in which one via-conductor is disposed continuously between the first and second branching portions per ceramic layer.

15. The multilayer substrate according to claim 1, wherein fewer number of ceramic layers are comprised in the first communicating portion than a number of the ceramic layers comprised in the second communicating portion.

16. The multilayer substrate according to claim 15, wherein the heat dissipating unit includes
a first branching portion disposed continuously from the component connecting unit with the first communicating portion interposed therebetween,
a second branching portion disposed continuously from the external connecting unit with the second communicating portion interposed therebetween, and
a third communicating portion in which one via-conductor is disposed continuously between the first and second branching portions per ceramic layer.

17. The multilayer substrate according to claim 1, wherein the heat dissipating unit includes
a first branching portion disposed continuously from the component connecting unit with the first communicating portion interposed therebetween,
a second branching portion disposed continuously from the external connecting unit with the second communicating portion interposed therebetween, and
a third communicating portion in which one via-conductor is disposed continuously between the first and second branching portions per ceramic layer.

18. The multilayer substrate according to claim 1, wherein the ceramic layers include
a first area where a plurality of the via-conductors are disposed, and
a second area where a plurality of the via-conductors are disposed, wherein fewer number of the via-conductors are disposed in the second area than the first area, the multilayer substrate further comprising:
- a first heat dissipating unit in which the via-conductors in the first area are disposed continuously; and
- a second heat dissipating unit in which the via-conductors in the second area are disposed continuously, wherein the first communicating portion of the first heat dissipating unit is shorter than the first communicating portion of the second heat dissipating unit.

19. The multilayer substrate according to claim 1, wherein:

the ceramic layers include
- a first area where a plurality of the via-conductors are disposed, and
- a second area where a plurality of the via-conductors are disposed, wherein fewer number of the via-conductors are disposed in the second area than the first area, the branching portion includes
- a first via-conductor disposed in the first area, as viewed from the stacking direction, and
- a second via-conductor disposed closer to the second area than the first via-conductor is, as viewed from the stacking direction; and a cross-sectional area of the first via-conductor as viewed from the stacking direction is smaller than a cross-sectional area of the second via-conductor as viewed from the stacking direction.

20. The multilayer substrate according to claim 1, wherein, in the branching portion, the plurality of via-conductors are disposed symmetrically with each other, as viewed from the stacking direction.

* * * * *